United States Patent

Urasaki et al.

[11] Patent Number: 5,839,011
[45] Date of Patent: Nov. 17, 1998

[54] APPARATUS FOR PROCESSING PHOTOSENSITIVE MATERIAL

[75] Inventors: Jun Urasaki; Yoshikazu Takano; Akira Kunihiro, all of Tokyo; Eiji Miyasaka, Shiga; Masaharu Kimura, Shiga; Yasuhiro Kawaguchi, Shiga, all of Japan

[73] Assignees: Mitsubishi Paper Mills Ltd., Tokyo; Dainippon Screen Mfg. Co., Ltd., Kyoto, both of Japan

[21] Appl. No.: 910,220

[22] Filed: Aug. 13, 1997

[30] Foreign Application Priority Data

Aug. 14, 1996 [JP] Japan .................................. 8-233649
Aug. 14, 1996 [JP] Japan .................................. 8-233650

[51] Int. Cl.$^6$ .................................................. G03D 5/06
[52] U.S. Cl. ...................... 395/606; 396/608; 396/611; 396/646
[58] Field of Search ................................. 396/604, 606, 396/607, 608, 645, 646

[56] References Cited

U.S. PATENT DOCUMENTS

| | | | |
|---|---|---|---|
| 3,104,603 | 9/1963 | Schwienbacher | 396/606 |
| 3,593,641 | 7/1971 | Adams | 396/604 |
| 3,728,114 | 4/1973 | Futaki et al. . | |
| 4,134,769 | 1/1979 | Yoshida et al. . | |
| 4,160,670 | 7/1979 | Tsubai et al. . | |
| 4,190,345 | 2/1980 | Taylor | 396/606 |
| 4,336,321 | 6/1982 | Kanada et al. . | |
| 4,425,869 | 1/1984 | Hull . | |
| 4,501,811 | 2/1985 | Saikawa et al. . | |
| 4,510,228 | 4/1985 | Tsubai et al. . | |
| 4,621,041 | 11/1986 | Saikawa et al. . | |
| 5,398,092 | 3/1995 | Tanno et al. . | |

FOREIGN PATENT DOCUMENTS

| | | |
|---|---|---|
| 0593854A2 | 7/1993 | European Pat. Off. . |
| 0593854A3 | 7/1993 | European Pat. Off. . |
| 0623854A1 | 4/1994 | European Pat. Off. . |
| 91 11 3763 | 11/1997 | European Pat. Off. . |
| 62-237455 | 10/1987 | Japan . |
| 63-132241 | 6/1988 | Japan . |
| 63-202750 | 8/1988 | Japan . |
| 63-261263 | 10/1988 | Japan . |
| 63-282740 | 11/1988 | Japan . |
| 64-90450 | 4/1989 | Japan . |
| 5-297598 | 11/1993 | Japan . |

Primary Examiner—A. A. Mathews
Attorney, Agent, or Firm—McDermott, Will & Emery

[57] ABSTRACT

The apparatus for coating a lithographic printing plate or a photosensitive material (M) with a processing liquid comprises first and second pairs of feed rollers (41,42: 44,45) for feeding the photosensitive arterial along a predetermined path. A coating roller (125) is provided therebetween. Guide members (48, 49) contact the bottom surface of the photosensitive material and to guide the photosensitive material. The contacts of the guide members and the photosensitive material are at the levels higher than the coating level at which the processing liquid is applied to the photosensitive material to prevent uneven coating of the photosensitive material with the processing liquid after the trailing edge of the photosensitive material has passed the first pairs of the feed rollers (41,42).

7 Claims, 10 Drawing Sheets

APPARATUS FOR PROCESSING PHOTOSENSITIVE MATERIAL

BACKGROUND OF THE INVENTION

1. Field of the Invention

The present invention relates to an apparatus for processing a photosensitive material with a processing liquid.

2. Description of the Background Art

Photosensitive materials, such as photosensitive films, photographic paper, lithographic printing plates and the like, on which images have been recorded are processed with a processing liquid such as activator, fixing solution, stabilizer, and rinsing water. Apparatuses for performing such processes upon photosensitive materials include a known dip-type processing apparatus wherein the photosensitive materials are fed into a processing tank storing a processing liquid by feeding means comprising pairs of feed rollers and the like and then dipped in the processing liquid, thereby subjected to processing.

Such an dip-type processing apparatus requires a great amount of processing liquid to dip the photosensitive materials therein. In the dip-type processing apparatus, the processing liquid is deactivated due to repeated processings for many photosensitive materials or developing degradation with time resulting from carbon dioxide and oxygen in the atmosphere. The processing liquid is recovered from the deactivation by adding a replenisher fluid to the processing liquid. This causes a difference between the ingredients of the processing liquid when the process starts and the ingredients of the processing liquid after a certain amount of process continues, failing to achieve exactly uniform processing.

To solve such a problem, a coat-type photosensitive material processing apparatus has been used for coating a photosensitive surface of the photosensitive material with the processing liquid in amounts required to process the photosensitive material to perform processing in place of immersing the photosensitive material in the processing liquid. An example of the conventional coat-type processing apparatus has metering means in which a wire bar including a shaft and a wire wound around the shaft in a spiral fashion is brought into contact with the photosensitive surface of the photosensitive material . The metering means is operable to meter the processing liquid and to apply the same to the photosensitive material, whereby the photosensitive material is coated with the processing liquid only in amounts required to process the photosensitive material.

The conventional coat-type processing apparatus has a first pair of feed rollers upstream of the metering means and a second pair of feed rollers downstream thereof, the two pairs of feed rollers for feeding the photosensitive material while holding the photosensitive material therebetween. The feed velocity of the photosensitive material passing through the metering means in a coating position becomes non-uniform at the time when the trailing edge of the photosensitive material passes between the first pair of feed rollers, resulting in uneven coating of the photosensitive material with the processing liquid.

Figure 8:
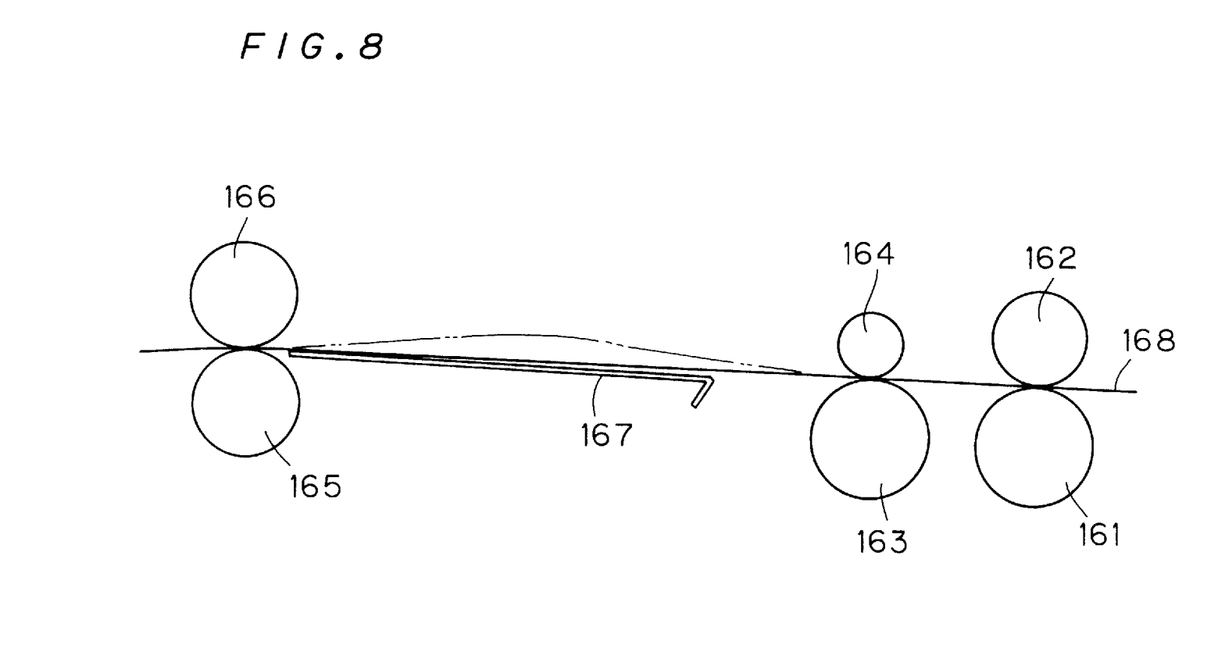
FIG. 8 illustrates a drawback of the background art.

The drawback is described in more detail with reference to FIG. 8. A development unit shown in FIG. 8 is designed such that a first pair of feed rollers 161, 162 and a second pair of feed rollers 165, 166 arranged in a horizontal direction feed a photosensitive material 168 guided by a guide member 167. The metering means comprises coating roller 164 including a wire bar and a backup roller 163 applies a processing liquid to the photosensitive surface of the photosensitive material 168 while metering the processing liquid. In the conventional apparatus, the photosensitive material 168 should be fed linearly in the horizontal direction as indicated by the solid line of FIG. 8.

However, the photosensitive material 168 itself is curled if the photosensitive material 168 is prepared, for example, by cutting a rolled elongated photosensitive material in position. Then, the leading edge of the photosensitive material 168 fed along a guide surface while being curled is held between the second pair of feed rollers 165, 166, with the photosensitive material 168 raised upwardly in its intermediate position into a curve. Since the first pair of feed rollers 161, 162 and the second pair of feed rollers 165, 166 rotate in synchronism with each other, the photosensitive material 168 being fed maintains its raised configuration.

As the trailing edge of the photosensitive material 168 fed continuously in the above described manner is removed from between the first pair of feed rollers 161, 162, the photosensitive material 168 will act to shift from the raised position indicated by the alternate long and two short dash line of FIG. 8 to a linear position indicated by the solid line of FIG. 8. This decreases the velocity at which the photosensitive material 168 coated with the processing liquid between the coating roller 164 and the backup roller 163 passes through the coating position. In extreme cases, the photosensitive material 168 slips between the coating roller 164 and the backup roller 163 to temporarily stop in the coating position. The non-uniform velocity of the photosensitive material 168 passing between the coating roller 164 and the backup roller 163 because of the above described phenomenon causes the uneven coating of the photosensitive material with the processing liquid.

If the coating roller 164 and the backup roller 163 rotate in synchronism with the first and second pairs of feed rollers 161, 162, 165, 166, the holding force of the coating roller 164 and the backup roller 163 which is operable to hold the photosensitive material 168 therebetween is not greater than that of the first and second pairs of feed rollers 161, 162, 165, 166, causing the photosensitive material 168 to readily slip between the coating roller 164 and the backup roller 163. Therefore, the holding force of the coating roller 164 and the backup roller 163 is not effective to provide a uniform velocity to the photosensitive material 168 passing therebetween.

The raised or curved configuration of the photosensitive material 168 being fed is caused not only when the photosensitive material 168 itself is curled as above described but also in a processing apparatus, for example, adapted to feed upwardly the photosensitive material 168 passed between the coating roller 164 and the backup roller 163 to enhance the function of the coating roller 164 to meter the processing liquid.

When a lithographic printing plate using a silver complex salt diffusion transfer reverse method (DTR method) wherein development proceeds rapidly is used as the photosensitive material 168, development requires the photosensitive surface of the photosensitive material 168 coated with the processing liquid by the coating roller 164 to be out of contact with any ambient object for a predetermined period of time. To meet the requirement, a great distance is established between the coating roller 164 and the second pair of feed rollers 165, 166. For this reason, the development unit for the lithographic printing plate using the silver complex salt diffusion transfer reverse method (DTR method) is liable to increase the raised curve of the lithographic printing plate to make the above described drawback more pronounced.

In the above described conventional apparatus, the photosensitive material is fed in the horizontal direction while passing through the metering means. This arrangement presents no problem when the photosensitive material is coated with a relatively great amount of processing liquid, but causes coating unevenness with the processing liquid when the photosensitive material is coated with a relatively small amount of processing liquid. Specifically, when the photosensitive material fed in the horizontal direction passes through the metering means, the volume of a puddle of processing liquid formed upstream of a contact region between the photosensitive material and the metering means in the feed direction of the photosensitive material influences the amount of processing liquid to be applied to the photosensitive material. For this reason and the like, the uneven coating of the photosensitive material with the processing liquid occurs, resulting in processing unevenness of the processed photosensitive material. This phenomenon is particularly pronounced when the lithographic printing plate using the silver complex salt diffusion transfer reverse method (DTR method) wherein development proceeds rapidly is used as the photosensitive material.

Additionally, the above described conventional apparatus attempts to minimize the amount of processing liquid to be consumed by coating the photosensitive surface of the photosensitive material with the processing liquid only in amounts required to process the photosensitive material by using the metering means for metering the amount of processing liquid to be applied to the photosensitive material. Unfortunately, the processing liquid is also deposited on the opposite surface of the photosensitive material from the photosensitive surface and is carried outwardly with the photosensitive material. In this manner, a certain amount of processing liquid which is not required for processing is wastefully consumed.

SUMMARY OF THE INVENTION

The present invention is directed to an apparatus for coating a photosensitive surface of a photosensitive material with a processing liquid while feeding the photosensitive material along a predetermined feed path, with the photosensitive surface positioned upside.

According to the present invention, the apparatus comprises: a first pair of feed rollers for feeding the photosensitive material while holding the photosensitive material therebetween; coating means provided on the downstream side from the first pair of feed rollers in the feed path for coating the photosensitive surface with the processing liquid, the coating means including restriction means for restricting the amount of the processing liquid to be supplied; a second pair of feed rollers provided on the downstream side from the first pair of feed rollers in the feed path for rotating in synchronism with the first pair of feed rollers to feed the photosensitive material while holding the photosensitive material therebetween; and first guide means provided between the coating means and the second pair of feed rollers for raising and guiding the photosensitive material.

In an aspect of the present invention, the first guide means contacts a back surface of the photosensitive material to scratch off an amount of the activator which is deposited on the back surface.

In a preferred embodiment of the present invention, the apparatus further comprising: second guide means provided between the first guide means and the second pair of feed rollers for supporting and guiding the back surface of the photosensitive material at a first level higher than a second level at which the coating means contacts the photosensitive material and a third level at which the second pair of feed rollers hold the photosensitive material therebetween.

Preferably, the second guide means has an upwardly raised guide surface.

Accordingly, an object of the present invention to provide a constantly uniform velocity of a photosensitive material passing at a coating position to uniformly coat the photosensitive material with a processing liquid.

It is another object of the present invention to uniformly coat a photosensitive material with a small amount of processing liquid.

It is still another object of the present invention to reduce the consumption of processing liquid which is not required for processing to a possible minimum amount.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. General Structure of Apparatus>

Figure 1:
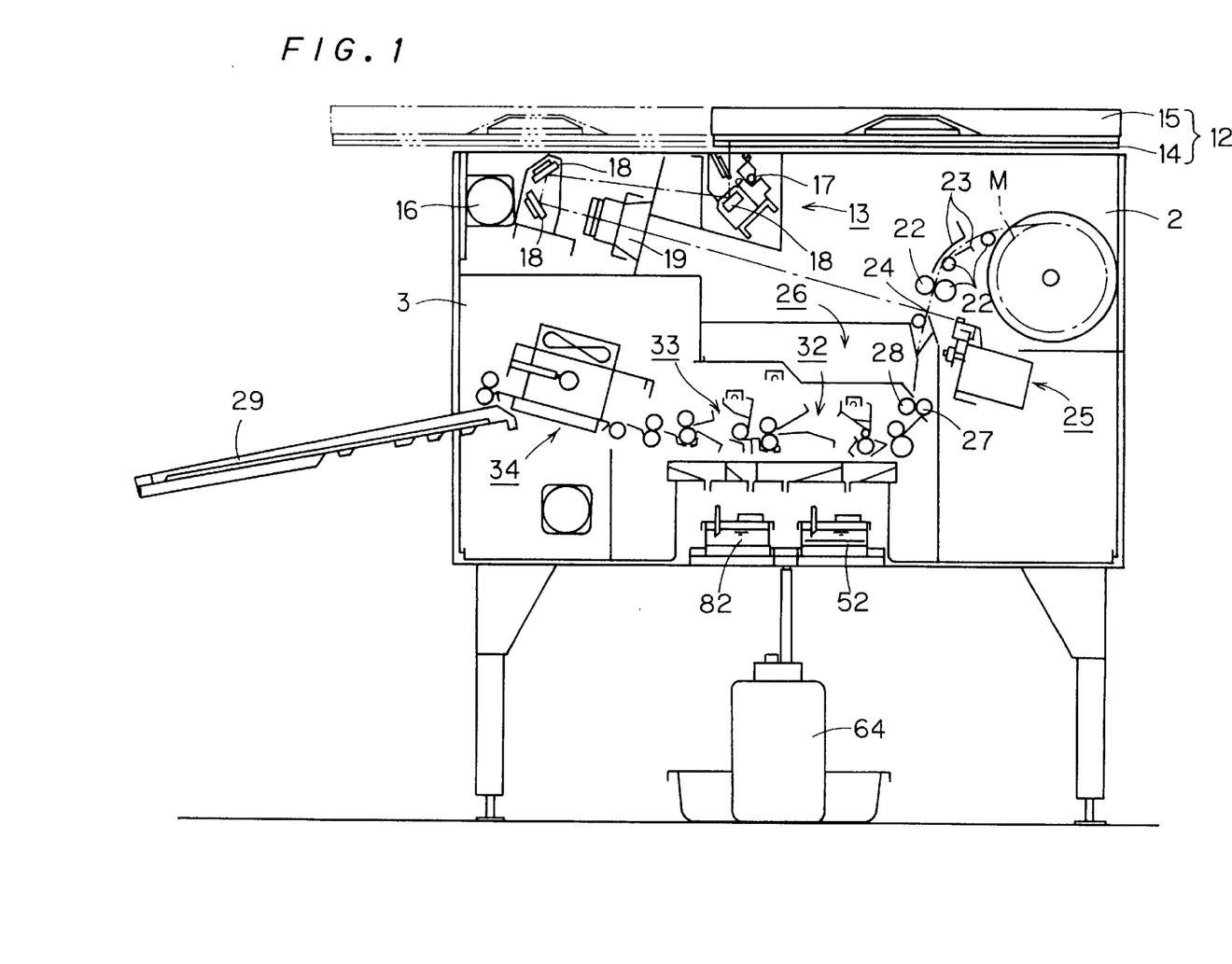
FIG. 1 is a schematic view of a plate making apparatus for lithographic printing plates according to a preferred embodiment of the present invention.

FIG. 1 is a schematic view of a plate making apparatus for lithographic printing plates, which comprises a photosensitive material processing apparatus according to the present invention.

The plate making apparatus employs a lithographic printing plate M using a silver complex salt diffusion transfer reverse method (DTR method) as a photosensitive material, and performs image exposure and development on the lithographic printing plate M. The plate making apparatus comprises an exposure unit 2 for exposing the lithographic printing plate M, and a development unit 3 for developing the exposed lithographic printing plate M.

The lithographic printing plate using the silver complex salt diffusion transfer reverse method (DTR method), particularly the lithographic printing plate having a physical development nuclei layer on a silver halide emulsion layer, is disclosed in U.S. Pat. Nos. 3,728,114; 4,134,769; 4,160, 670; 4,336,321; 4,501,811; 4,510,228; and 4,621,041. The exposed silver halide gives rise to chemical development upon the DTR development to change into black silver, forming a hydrophilic non-image area. A silver salt complexing agent in an activator changes unexposed silver halide crystal into silver complex which in turn is diffused to the physical development nuclei layer at the surface and gives rise to physical development because of the presence of nuclei to form an image area principally comprising ink-receptive physically developed silver.

The exposure unit 2 is described first. The exposure unit 2 projects light reflected from an original held by an original holder 12 onto a surface of the lithographic printing plate M by means of a projection optical system 13 to expose the lithographic printing plate M, thereby forming the image of the original on the lithographic printing plate M.

The original holder 12 includes a transparent plate 14 for placing the original thereon, and a top cover 15 which is openable and closable relative to the transparent plate 14, and is movable horizontally in reciprocal manner between a position indicated by the solid lines of FIG. 1 and a position indicated by the alternate long and two short dash lines of FIG. 1 while holding the original by driving a motor 16. The projection optical system 13 is fixed under the path of reciprocal movement of the original holder 12, and includes a rod-shaped light source 17 for directing illumination light onto the surface of the original held by the original holder 12 and moving in the horizontal direction, a plurality of reflecting mirrors 18 for guiding the light emitted from the light source 17 and reflected from the original, and a projection lens 19 for projecting the light guided by and reflected from the plurality of reflecting mirrors 18 onto the lithographic printing plate M.

The exposure unit 2 exposes the lithographic printing plate M to form the original image to the lithographic printing plate M in a manner to be described below. Initially, the original holder 12 is located in the position indicated by the solid lines of FIG. 1. The original is placed on the transparent plate 14, with the top cover 15 opened, and the top cover 15 is then closed to hold the original in the original holder 12. With the light source 17 remains on, the original holder 12 is moved leftwardly as shown in FIG. 1. In synchronism with the leftward movement of the original holder 12, a plurality of feed rollers 22 and a plurality of guide members 23 feed the leading edge of the rolled lithographic printing plate M at the same velocity as the original holder 12 being moved. Then, the original held by the original holder 12 sequentially receives light illumination from the light source 17. The light reflected from the original is directed through the plurality of reflecting mirrors 18 and the projection lens 19 onto the surface of the lithographic printing plate M moving at the same velocity as the original holder 12 being moved to expose the lithographic printing plate M, thereby forming a latent original image to the lithographic printing plate M.

The exposed lithographic printing plate M to which the latent image is formed is fed from the exposure unit 2 to the development unit 3 in the latter stage, and processed in the development unit 3. A cutting unit 25 provided adjacent the outlet of the exposure unit 2 includes a cutter 24 movable in the direction perpendicular to a forward direction (feed direction) of the lithographic printing plate M, and cuts the lithographic printing plate M at the rear end where the exposure ends.

The lithographic printing plate M is not permitted to simply travel from the exposure unit 2 to the development unit 3 since the velocity at which the lithographic printing plate M is fed in the exposure unit 2 is lower than the velocity at which the lithographic printing plate M is fed in the development unit 3. Further, the feeding operation of the lithographic printing plate M must be suspended when the cutting unit 25 cuts the lithographic printing plate M. For these reasons, a buffer portion 26 for the lithographic printing plate M is provided between the exposure unit 2 and the development unit 3. A pair of rollers 27 and 28 in the buffer portion 26 stop rotating for a given period of time during the feeding operation of the lithographic printing plate M which has been exposed in the exposure unit 2 to store a given length of the lithographic printing plate M in the buffer portion 26 prior to the feeding operation of the lithographic printing plate M to the development unit 3.

<B. Overview of Development Unit 3>

<B-1. Structure of Development Unit 3>

Figure 2:
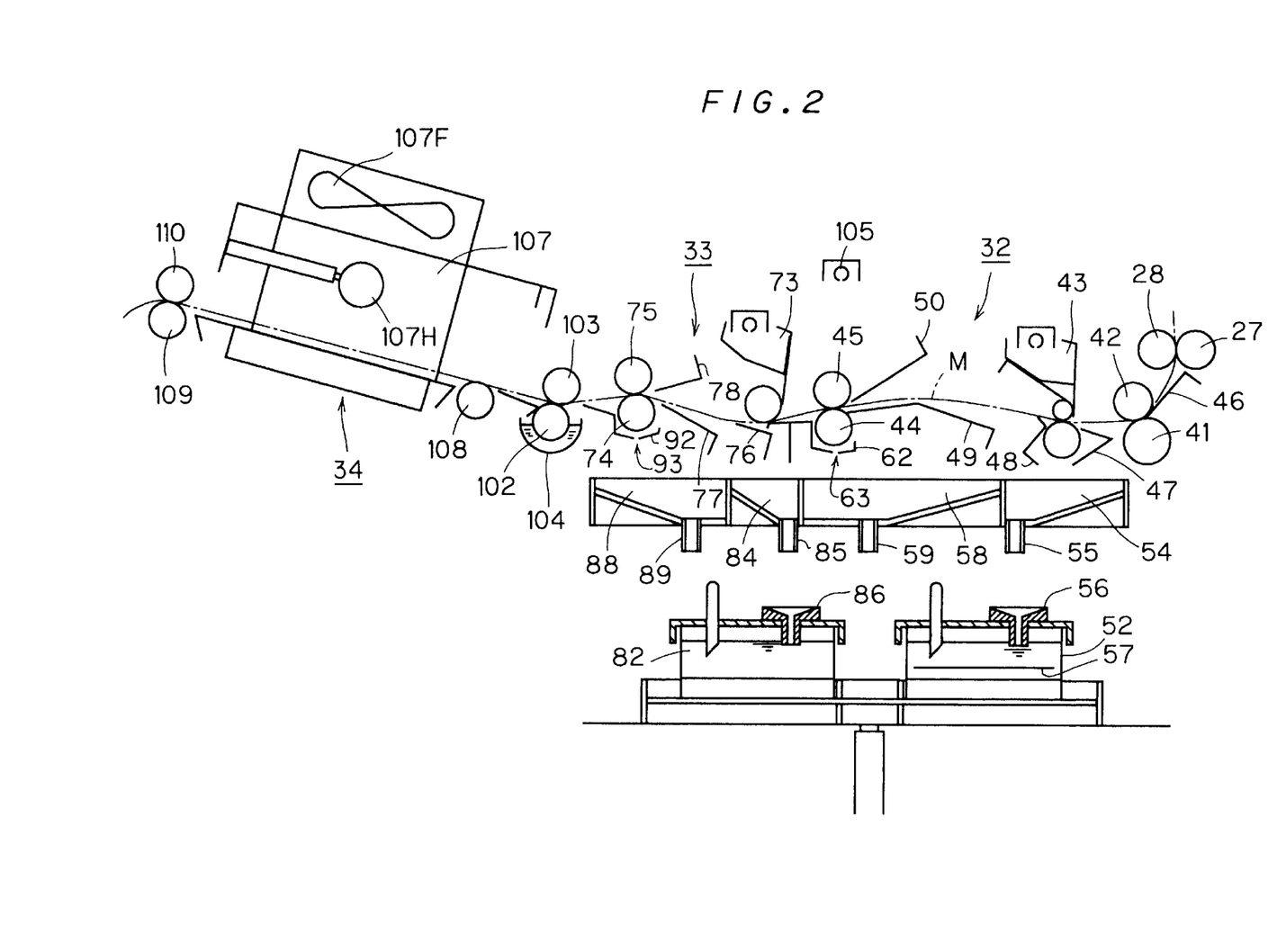
FIG. 2 is a schematic view of a development unit.
Figure 3:
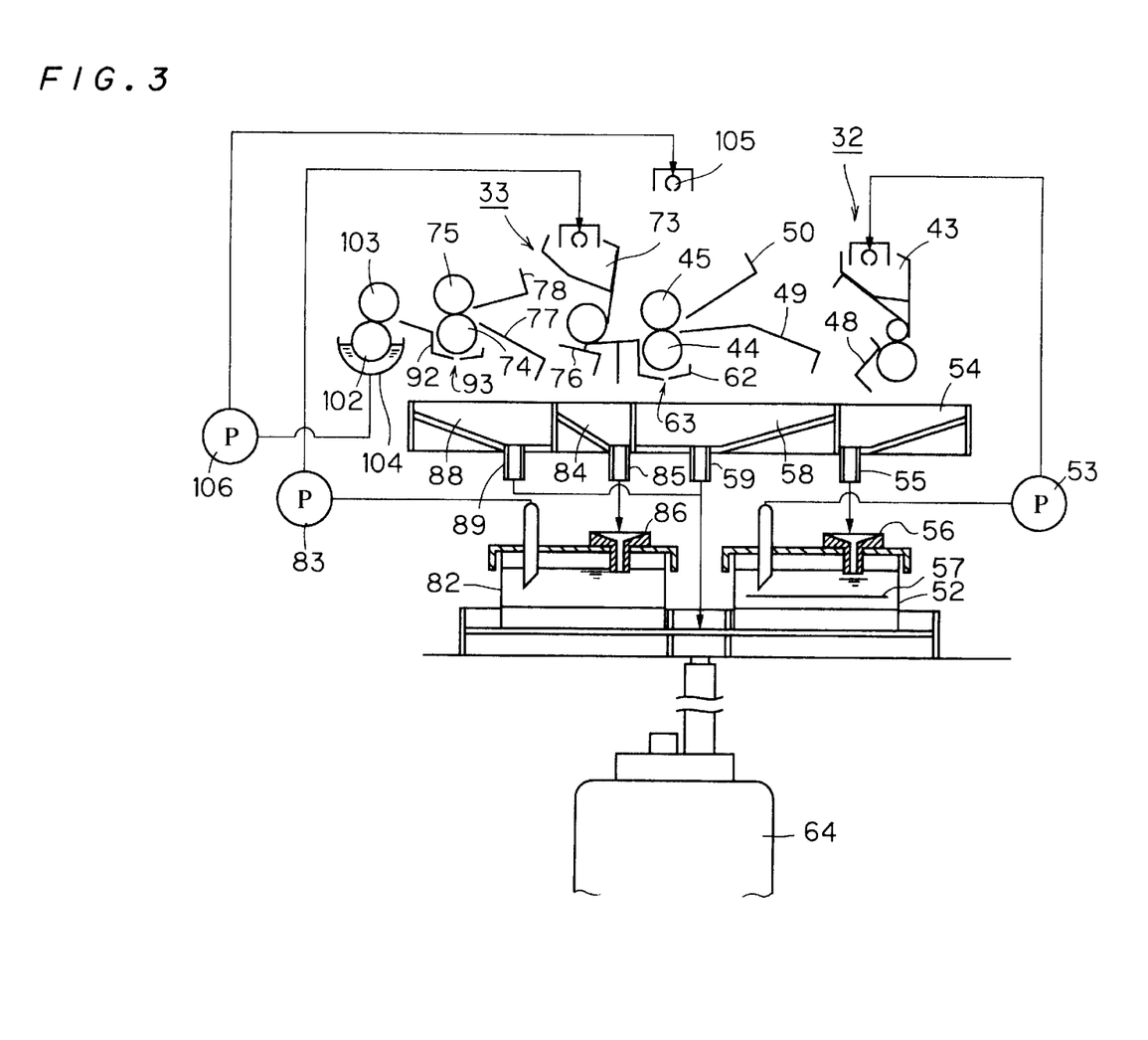
FIG. 3 is a schematic view of a piping system for the development unit.

The structure of the development unit 3 according to the present invention is discussed hereinafter. FIG. 2 is an enlarged schematic view of the development unit 3 shown in FIG. 1. FIG. 3 is a schematic view of a piping system for the development unit 3.

The development unit 3 comprises a development portion 32 for coating the exposed lithographic printing plate M with an activator to develop the exposed lithographic printing plate M, a stabilization portion 33 for coating the developed lithographic printing plate M with a stabilizer to stabilize the developed lithographic printing plate M, and a drying portion 34 for drying the stabilized lithographic printing plate M.

<B-2. Development Portion 32>

The development portion 32 includes a pair of introduction rollers 41, 42 for feeding the lithographic printing plate M fed by the rollers 27 and 28 of the buffer portion 26 to the development portion 32 while holding the lithographic printing plate M therebetween; an activator coating mechanism 43 for metering a constant amount of activator to apply the metered activator to the photosensitive surface of the lithographic printing plate M fed by the pair of introduction rollers 41, 42; a pair of squeezing rollers 44, 45 for removing the activator provided for development from the lithographic printing plate M; and a plurality of guide members 46, 47, 48, 49, 50 for guiding the lithographic printing plate M.

The lower one 41 of the pair of introduction rollers 41, 42 is a heat roller containing a heater for heating the lithographic printing plate M passing therethrough. The lithographic printing plate M is preheated prior to development in order to prevent the temperature of a small amount of temperature-controlled activator contacting the lithographic printing plate M from decreasing because of the heat capacity of the lithographic printing plate M when the lithographic printing plate M is coated with the activator and developed.

The pair of introduction rollers 41, 42 including the heat roller function as a first pair of feed rollers for holding the lithographic printing plate M therebetween to feed the lithographic printing plate M. The pair of squeezing rollers 44, 45 for removing the activator from the lithographic printing plate M function as a second pair of feed rollers for holding the lithographic printing plate M therebetween to feed the lithographic printing plate M. The guide member 49 functions as a member for guiding the lithographic printing plate M passed through the activator coating mechanism 43 serving as a processing liquid coating portion to the pair of squeezing rollers 44, 45. The functions of the rollers 41, 42, 44, 45 and the guide member 49 are described later in detail.

Referring to FIG. 3, the activator coating mechanism 43 is connected to an activator tank 52 for storing the activator therein through a pump 53. A recovery tray 54 is provided under the activator coating mechanism 43. The activator in the activator tank 52 is delivered to the activator coating mechanism 43 under pressure by the pump 53 and fed onto the lithographic printing plate M. An amount of activator which has not coated the lithographic printing plate M, such as an amount of activator which flows out of opposite sides and rear end of the lithographic printing plate M, drops into the recovery tray 54. The dropped activator which is reusable drops through a recovery pipe 55 provided at the lower end of the recovery tray 54 into an activator receiving portion 56 of the activator tank 52 and is collected in the activator tank 52. The activator tank 52 contains a panel heater 57 to maintain a predetermined temperature of the activator circulating in the activator circulation passage extending from the activator tank 52 to the activator coating mechanism 43.

A recovery tray 58 is provided under the pair of squeezing rollers 44, 45. The fatigued activator removed from the lithographic printing plate M by the pair of squeezing rollers 44, 45 drops through a recovery hole 63 of an activator receiving member 62 provided under the pair of squeezing rollers 44, 45 into the recovery tray 58. The fatigued activator which is not reusable is discharged to a drain tank 64 through a recovery pipe 59 provided at the lower end of the recovery tray 58.

Figure 4:
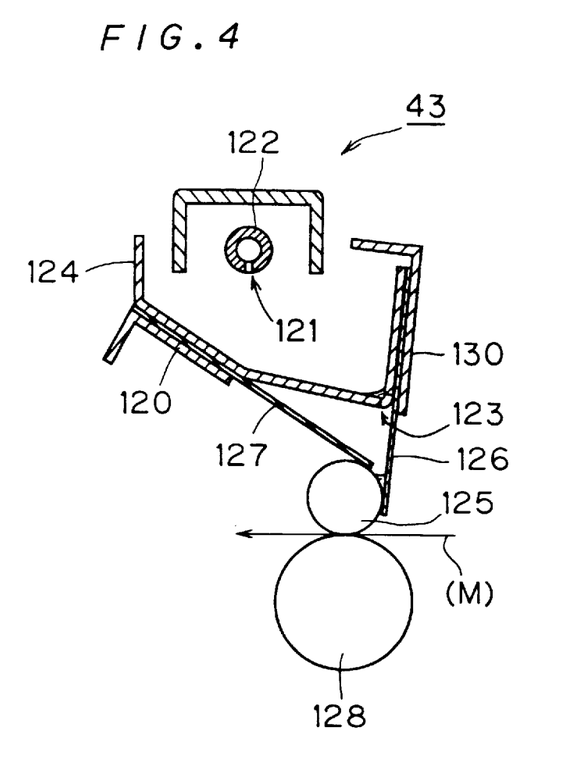
FIG. 4 is a schematic view of an activator coating mechanism.

With reference to FIG. 4, the activator coating mechanism 43 includes an activator supply pipe 122 having a plurality of discharge holes 121 bored through its lower position; an activator receiving portion 124 having a plurality of openings 123 bored through its lower end for allowing the activator to flow downwardly therethrough; and a coating roller 125 having a surface formed with a plurality of grooves and rotating in contact with the lithographic printing plate M. A diffusion film 126 guides the activator flowing down from the openings 123 of the activator receiving portion 124 to the coating roller 125. An anti-backflow film 127 prevents a backflow of the activator flowing down from the openings 123 of the activator receiving portion 124. A backup roller 128 is in contact with the coating roller 125. The arrow of FIG. 4 indicates the feed direction of the lithographic printing plate M.

The activator supply pipe 122 is connected to the above described activator tank 52 through the pump 53, and is driven by the pump 53 to discharge the activator through the plurality of discharge holes 121. The activator is received once in the activator receiving portion 124 and then flows downwardly through the plurality of openings 123 toward the diffusion film 126. The activator flowing downwardly through the openings 123 of the activator receiving portion 124 is stored once in a recess formed on a contact region between the coating roller 125 and the diffusion film 126 and is then diffused in the direction orthogonal to the feed direction of the lithographic printing plate M. Then, as the coating roller 125 rotates, the activator passes through openings defined by the grooves of the coating roller 125 toward a contact region between the coating roller 125 and the backup roller 128 to form a puddle of activator therein.

The activator is applied to the photosensitive surface of the lithographic printing plate M when the lithographic printing plate M passes through the puddle of activator. Since the backup roller 128 presses the photosensitive surface of the lithographic printing plate M against the surface of the coating roller 125, the openings defined by the grooves of the coating roller 125 meter a constant amount of the activator applied to the photosensitive surface of the lithographic printing plate M. Thus, the photosensitive surface of the lithographic printing plate M passed through the contact region between the backup roller 128 and the coating roller 125 is constantly coated with the constant amount of activator required for development.

<B-3. Stabilization Portion 33>

Referring again to FIG. 3, the stabilization portion 33 includes a stabilizer coating mechanism 73 for metering a constant amount of stabilizer to apply the metered stabilizer to the photosensitive surface of the lithographic printing plate M fed from the development portion 32 and a pair of squeezing rollers 74, 75 for removing the stabilizer provided for stabilization from the lithographic printing plate M. A plurality of guide members 76, 77, 78 are provided for guiding the lithographic printing plate M.

The stabilizer coating mechanism 73 is connected to a stabilizer tank 82 for storing the stabilizer therein through a pump 83. A recovery tray 84 is provided under the stabilizer coating mechanism 73. The stabilizer in the stabilizer tank 82 is delivered to the stabilizer coating mechanism 73 under pressure by the pump 83 and fed onto the lithographic printing plate M. An amount of stabilizer which has not coated the lithographic printing plate M, such as an amount of stabilizer which flows out of opposite sides and rear end of the lithographic printing plate M, is reusable and drops into the recovery tray 84. The dropped stabilizer drops through a recovery pipe 85 provided at the lower end of the recovery tray 84 into a stabilizer receiving portion 86 of the stabilizer tank 82 and is collected in the stabilizer tank 82.

A recovery tray 88 is provided under the pair of squeezing rollers 74, 75. The stabilizer removed from the lithographic printing plate M by the pair of squeezing rollers 74, 75 drops through a recovery hole 93 of a stabilizer receiving member 92 provided under the pair of squeezing rollers 74, 75 into the recovery tray 88. The dropped stabilizer which is not reusable is discharged through a recovery pipe 89 at the lower end of the recovery tray 88 to the drain tank 64.

<B-4. Stabilizer Coating Mechanism 73>

Figure 5:
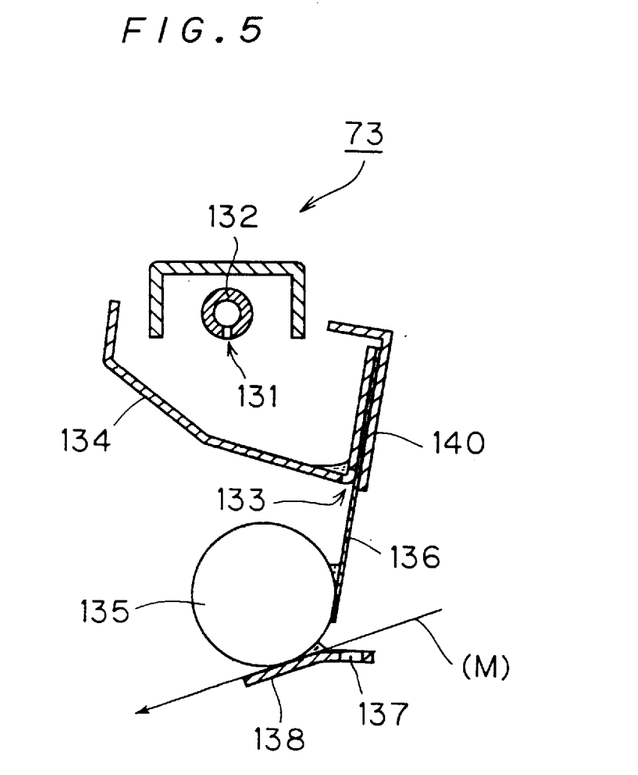
FIG. 5 is a schematic view of a stabilizer coating mechanism.

With reference to FIG. 5, the stabilizer coating mechanism 73 includes a stabilizer supply pipe 132 having a plurality of discharge holes 131 bored at its lower position; a stabilizer receiving portion 134 having a plurality of openings 133 bored at its lower end for allowing the stabilizer to flow downwardly therethrough; and a coating roller 135 having a surface made of sponge containing a large number of separate pores and rotating in contact with the lithographic printing plate M. A diffusion film 136 has an uneven surface for guiding to the coating roller 135 the stabilizer flowing down from the openings 133 of the stabilizer receiving portion 134. A plate spring 138 urges the lithographic printing plate M toward the coating roller 135. The arrow of FIG. 5 indicates the feed direction of the lithographic printing plate M.

The stabilizer supply pipe 132 is connected to the above described stabilizer tank 82 through the pump 83, and is driven by the pump 83 to discharge the stabilizer from the plurality of discharge holes 131. The stabilizer is received once in the stabilizer receiving portion 134 and then flows downwardly through the plurality of openings 133 toward the diffusion film 136. The stabilizer flowing downwardly through the openings 133 of the stabilizer receiving portion 134 is stored once in a contact region between the coating roller 135 and the diffusion film 136 and is then diffused in the direction orthogonal to the feed direction of the lithographic printing plate M. Then, as the coating roller 135 rotates, the stabilizer passes through openings defined by the uneven surface of the diffusion film 136 toward a contact region between the coating roller 135 and the plate spring 138 to form a puddle of stabilizer therein.

The stabilizer is applied to the photosensitive surface of the lithographic printing plate M when the lithographic printing plate M passes through the puddle of stabilizer. Since the plate spring 138 presses the photosensitive surface of the lithographic printing plate M against the surface of the coating roller 135, the multiplicity of separate pores contained in the sponge of the surface of the coating roller 135 meter a given amount of the stabilizer applied to the photosensitive surface of the lithographic printing plate M. Thus, the photosensitive surface of the lithographic printing plate M passed through the contact region between the plate spring 138 and the coating roller 135 is constantly coated with the given amount of stabilizer required for stabilization.

The plate spring 138 has an overflow hole 137 for preventing the stabilizer from being stored in an amount more than necessary in the contact region between the plate spring 138 and the coating roller 135 which might result in the puddle having an excess volume.

<B-5. drying portion 34>

The drying portion 34 (FIG. 2) includes a rubber roller 102 for supporting and feeding the lithographic printing plate M fed from the stabilization portion 33; a mirror surface roller 103 for abutting against the rubber roller 102 at a predetermined pressure to prevent the drying unevenness of the lithographic printing plate M; and a cleaning solution reservoir 104 for supplying a cleaning solution to the mirror surface roller 103 through the rubber roller 102. A drying mechanism 107 comprises a fan 107F and a heater 107H and for drying the lithographic printing plate M by exposure to hot air. A plurality of feed rollers 108, 109, 110 are provided for feeding the lithographic printing plate M. As depicted in FIG. 3, the cleaning solution reservoir 104 is connected through a pump 106 to a cleaning solution supply pipe 105 for supplying the cleaning solution to the pair of squeezing rollers 44, 45 of the development portion 32.

<C. Operation of Development Unit 3>

The development unit 3 develops the lithographic printing plate M in a manner to be described below.

The lithographic printing plate M with a latent image recorded thereon by the exposure unit 2 in the preceding stage is fed by the pair of introduction rollers 41, 42, and coated with the activator in an amount required for development thereof by the activator coating mechanism 43. The development of the photosensitive surface of the lithographic printing plate M coated with the activator only in the amount required for development is completed while the lithographic printing plate M is fed in a spatial development portion extending from the activator coating mechanism 43 to the pair of squeezing rollers 44, 45. The activator used for the development and remaining on the lithographic printing plate M is removed by the pair of squeezing rollers 44, 45. Then, the lithographic printing plate M is coated with the stabilizer in an amount required for stabilization thereof by the stabilizer coating mechanism 73. The lithographic printing plate M coated with the stabilizer only in the amount required for stabilization is stabilized while being fed to the pair of squeezing rollers 74, 75. The stabilizer used for the stabilization and remaining on the lithographic printing plate M is removed by the pair of squeezing rollers 74, 75. The lithographic printing plate M which has been stabilized is pushed by the mirror surface roller 103 for prevention of the drying unevenness, dried by the drying mechanism 107, and then discharged onto a discharge tray 29 shown in FIG. 1.

The development unit 3 is adapted to coat the lithographic printing plate M with the activator only in the amount required for development, thereby permitting the use of a decreased amount of activator required for processing. Further, the substantially unused activator is supplied to the lithographic printing plate M to perform constantly uniform processing on the lithographic printing plate M.

<D. Guide Member 48 in Development Portion>

Figure 6A:
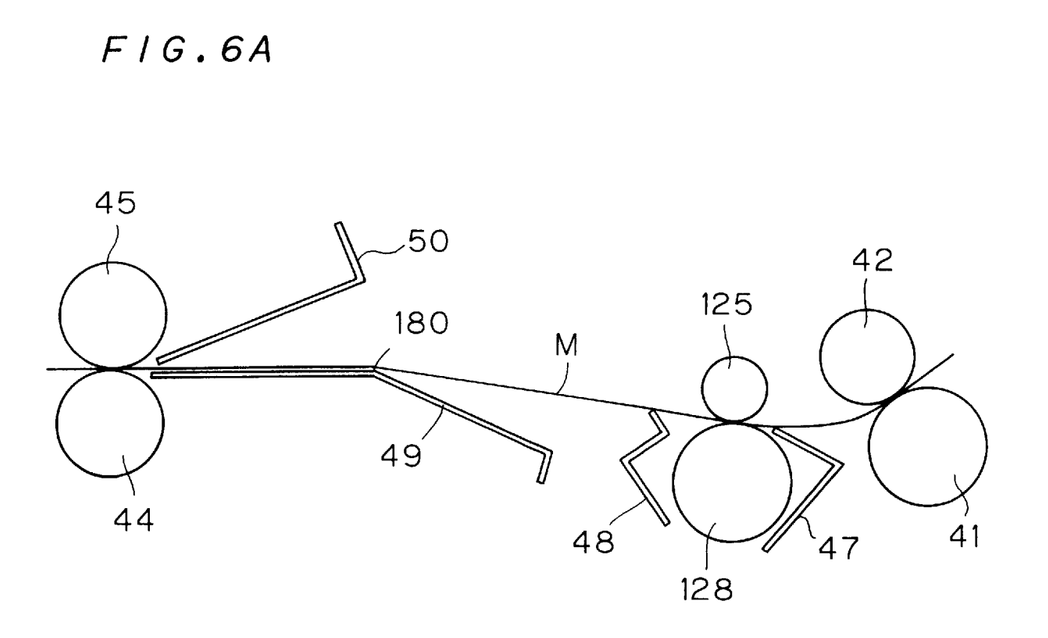
FIG. 6A is a partially enlarged schematic side view of a development portion.

Description is given on a structure for guiding the lithographic printing plate M coated with the activator upwardly as above described in the development portion 32. FIG. 6A is a partially enlarged schematic view of the development portion 32.

The lithographic printing plate M fed by the pair of introduction rollers 41, 42 and guided by the guide member 47 is inserted between the coating roller 125 and the backup roller 128. When the lithographic printing plate M passes between the coating roller 125 and the backup roller 128, the activator is applied to the photosensitive surface of the lithographic printing plate M and the coating roller 125 meters the amount of activator to be applied to the lithographic printing plate M.

The lithographic printing plate M passed between the coating roller 125 and the backup roller 128 is guided upwardly by the guide member 48 provided on opposite side from the photosensitive surface of the lithographic printing plate M for contacting the opposite surface of the lithographic printing plate M from the photosensitive surface.

Figure 6B:
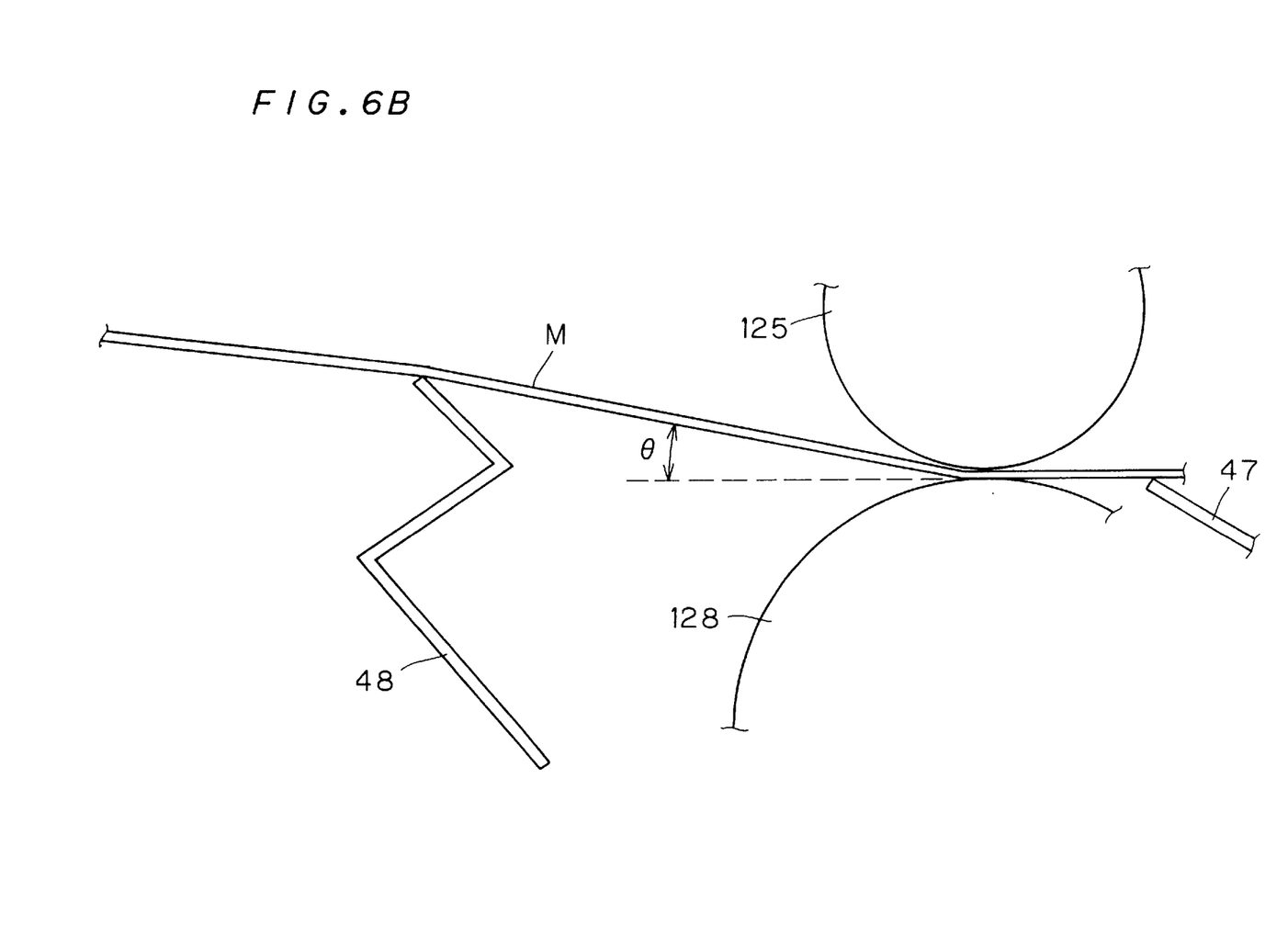
FIG. 6B is a further enlarged view of a part of FIG. 6A.

More specifically, the guide member 48 is a bent plate-like member extending in a direction orthogonal to the feed direction of the lithographic printing plate M (in a direction perpendicular to the plane of FIG. 6A). An upper end of the guide member 48 functions as a contact portion for sliding contact with the opposite surface of the lithographic printing plate M from the photosensitive surface as the lithographic printing plate M is fed. The contact portion at the upper end of the guide member 48 is positioned at a level slightly higher than that of the contact region between the coating roller 125 and the backup roller 128. Thus, the lithographic printing plate M passed between the coating roller 125 and the backup roller 128 and fed in contact with the guide member 48 is guided upwardly at an angle θ with respect to the horizontal, as illustrated in FIG. 6B which is a partial enlarged view of FIG. 6A. The broken line in FIG. 6B is a horizontal reference line from which the angle θ is measured.

The activator supplied through the diffusion film 126 (FIG. 4) to the coating roller 125 forms a puddle in the contact region between the coating roller 125 and the lithographic printing plate M at a position upstream of the metering position of the coating roller 125. However, since the lithographic printing plate M is guided upwardly after contacting the coating roller 125 as illustrated in FIG. 6A, the volume of the puddle of activator exerts no influences upon the amount of activator to be applied to the lithographic printing plate M.

If the guide member 48 is not present, the opposite surface of the lithographic printing plate M from the photosensitive surface is also coated with the activator when the photosensitive surface of the lithographic printing plate M passing between the coating roller 125 and the backup roller 128 is coated with the activator. The activator applied to the opposite surface from the photosensitive surface is not used for development. Discarding the activator on the opposite surface is wasteful consumption of the activator.

However, the apparatus according to the preferred embodiment is provided with the guide member 48. The contact portion at the upper end of the guide member 48 is in sliding contact with the opposite surface from the photosensitive surface of the lithographic printing plate M passed between the coating roller 125 and the backup roller 128 as above described. This allows the guide member 48 to scratch off the activator applied to and deposited on the opposite surface of the lithographic printing plate M from the photosensitive surface. The activator removed by the guide member 48 drops from the guide member 48 into the recovery tray 54 as above described. The dropped activator, as shown in FIG. 3, further drops through the recovery pipe 55 provided at the lower end of the recovery tray 54 into the activator receiving portion 56 of the activator tank 52 and is collected in the activator tank 52. This prevents the activator from being deposited on and carried by the opposite surface of the lithographic printing plate M from the photosensitive surface which might lead to wasteful consumption of the activator.

The lithographic printing plate M passed over the guide member 48 is guided by the guide members 49, 50 and inserted between the pair of squeezing rollers 44, 45.

Preferably, the angle θ (FIG. 6B) at which the lithographic printing plate M is guided upwardly ranges from 3 to 35 degrees. When the angle θ is less than 3 degrees, the activator forming a puddle, if having an increased volume, in the contact region between the coating roller 125 and the lithographic printing plate M upstream of the metering position of the coating roller 125 might pass through the openings 125c defined by the grooves of the coating roller 125 to flow outwardly in the feed direction of the lithographic printing plate M, depending upon the viscosity of the activator. When the angle θ is greater than 35 degrees, the activator applied to the lithographic printing plate M might produce a backflow in the direction opposite from the feed direction, depending upon the viscosity of the activator.

Similar to the guide member 48, the guide member 76 of the stabilization portion 33 which is in contact with the opposite surface from the photosensitive surface of the lithographic printing plate M passed between the coating roller 135 and the plate spring 138 and coated with the stabilizer also functions to scratch off the stabilizer applied to the opposite surface of the lithographic printing plate M from the photosensitive surface.

<E. Guide Member 49 in Development Portion>

The guide member 49 in the development portion 32 is discussed hereinafter.

As described hereinabove with reference to FIG. 6A, the photosensitive surface of the lithographic printing plate M held between and fed by the pair of introduction rollers 41, 42 serving as the first pair of feed rollers is coated with the activator as the lithographic printing plate M is guided by the guide member 47 to pass between the backup roller 128 and the coating roller 125 serving as the processing liquid coating member in the activator coating mechanism 43. The coating roller 125 and the backup roller 128 rotate so that the outer peripheral surfaces thereof move in the same direction as the feed direction of the lithographic printing plate M to function to assist in feeding the lithographic printing plate M. However, the coating roller 125 and the backup roller 128 do not ensure the feeding of the lithographic printing plate M since the primary object of the rollers 125 and 128 is to meter and apply the activator to the lithographic printing plate M.

The lithographic printing plate M passed between the coating roller 125 and the backup roller 128 is guided upwardly by the guide member 48 contacting the opposite surface of the lithographic printing plate M. The guide member 48 guides the lithographic printing plate M upwardly in order to prevent the activator from flowing outwardly in the forward direction of the lithographic printing plate M during the metering of the activator applied to the lithographic printing plate M using the openings defined by the grooves of the coating roller 125, which might lead to failure of correct metering.

Figure 6C:
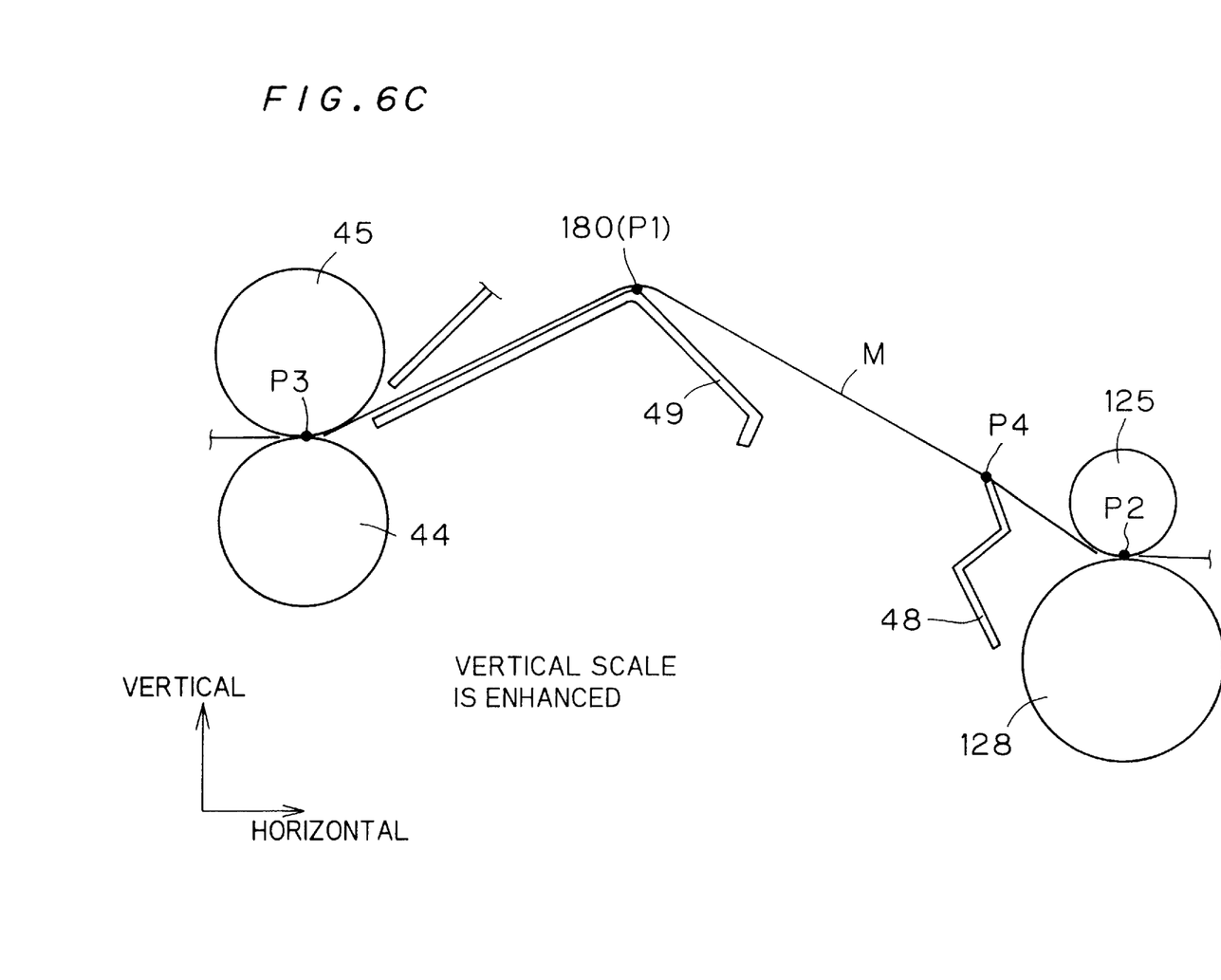
FIG. 6C is a partial view of FIG. 6A at an enhanced scale for the vertical direction.
Figure 7:
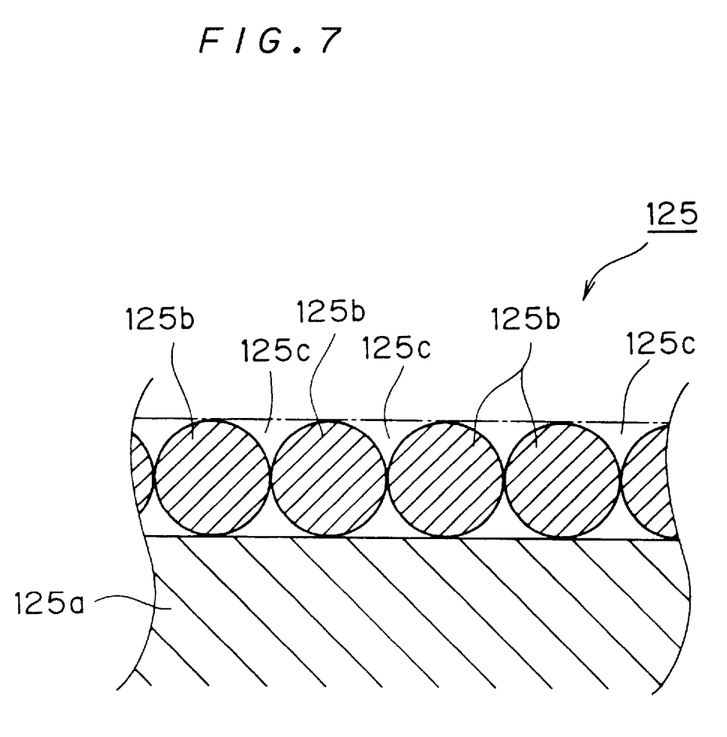
FIG. 7 is a partially enlarged cross-sectional view of a coating roller.

The lithographic printing plate M guided upwardly by the guide member 48 is guided by the guide members 49 and 50 to the pair of squeezing rollers 44, 45 serving as the second pair of feed rollers and then held between and fed by the squeezing rollers 44, 45. FIG. 6C is a partial view of FIG. 6A, in which a vertical scale is enhanced for easy understanding of the relation between the level of the guide member 49 and the respective levels of the rollers 44, 45, 125, 128. As illustrated in FIG. 6C, the guide member 49 is of an upwardly raised configuration and has a top portion 180 which is located at a level P1 higher than any one of:

1) the level P2 of contact between the coating roller 125 and the lithographic printing plate M;

2) the level P3 at which the pair of squeezing rollers 44, 45 hold the lithographic printing plate M therebetween; and 3) the level P4 of the top end of the guide member 48.

In this arrangement, the lithographic printing plate M having the photosensitive surface coated with the activator by passing between the coating roller 125 and the backup roller 128 is guided upwardly by the guide member 48. The leading edge of the lithographic printing plate M is hence fed once upwardly and then moves downwardly. Thus, the lithographic printing plate M, like the photosensitive material 168 shown in FIG. 8, moves in the raised or curved configuration toward the pair of squeezing rollers 44, 45. Since the guide member 49 is of the upwardly raised configuration and has the top portion 180 which is located at a level P1 higher than any one of the positions P2, P3 and P4 of FIG. 6C, the lithographic printing plate M of the raised or curved configuration has a lower surface guided constantly by the guide member 49 and travels a minimum distance in a feedable region.

After the lithographic printing plate M has passed the contact region between the pair of introduction rollers 41, 42 and the holding force of the lithographic printing plate M has been lost, the trailing edge of the lithographic printing plate M might slip between the coating roller 125 and the backup roller 128. However the guide member 49 constantly in contact with the lower surface of the lithographic printing plate M being fed allows the lithographic printing plate M to maintain the same raised or curved configuration before and after the trailing edge of the lithographic printing plate M passes between the pair of introduction rollers 41 and 42. Therefore, there is no variations in feed velocity of the lithographic printing plate M passing between the coating roller 125 and the backup roller 128 at the coating position. This provides for uniform coating of the lithographic printing plate M with the activator.

The guide member 49, which is configured to guide the lithographic printing plate M to a level higher than the highest point to be reached by the lithographic printing plate M coated with the activator, exhibits particularly effective effects. It is thus preferable to consider the angle at which the lithographic printing plate M is directed upwardly by the guide member 48 and the degree of curl of the lithographic printing plate M to determine the altitude of the top portion 180 of the guide member 49. Additionally, the lithographic printing plate M can be in the shape of a downwardly raised curl. Therefore, the guide member 48 is preferably of the upwardly raised configuration such as an inverted V-shaped (an mountain-like shaped) and an inverted U-shaped (a bow-like shaped) configurations.

<F. Other Preferred Embodiments>

The metering means may comprise metering rollers having an otherwise uneven surface. These rollers may be used in non-rotative relation. Furthermore, metering means other than rollers may be used.

Separate mechanisms may be individually used to supply the activator to the lithographic printing plate M and to meter the activator.

The guide means is not limited to the guide member 48 comprised of the bent plate-like member extending in the direction orthogonal to the feed direction of the lithographic printing plate M (in the direction perpendicular to the plane of FIG. 6A). It is preferred that the guide means is capable of relatively sliding throughout the entire opposite surface of the lithographic printing plate M from the photosensitive surface as the lithographic printing plate M is fed in order to remove the activator deposited on the opposite surface of the lithographic printing plate M from the photosensitive surface.

In the above described preferred embodiment, the guide member 48 serving as a second guide member guides upwardly the lithographic printing plate M coated with the activator. The present invention, however, is not limited to such an arrangement. For example, the present invention is effectively applicable when the lithographic printing plate M guided in the horizontal direction is not linearly fed between the position of contact between the coating roller 125 and the lithographic printing plate M and the position at which the pair of squeezing rollers 44, 45 hold the lithographic printing plate M therebetween due to curl of the lithographic printing plate M and the like.

The lithographic printing plate M using the silver complex salt diffusion transfer reverse method (DTR method) is used as the photosensitive material in the above described preferred embodiment. The present invention, however, may be applied to a photosensitive material processing apparatus which uses other various photosensitive materials.

<G. Advantages of the Apparatus>

The apparatus according to the preferred embodiments is advantageous in the following points:

The top portion 180 of the second guide means 49 for guiding the lithographic printing plate M passed through the processing liquid coating means 125, 128 to the second pair of feed rollers 44, 45 is located at the level higher than the level at which the processing liquid coating means 125, 128 contacts the lithographic printing plate M and the level at which the second pair of feed rollers 44, 45 hold the lithographic printing plate M therebetween. This prevents the non-uniform feed velocity of the lithographic printing plate M fed by the processing liquid coating means 125, 128 in the coating position after the trailing edge of the lithographic printing plate M is removed from between the first pair of feed rollers 41, 42, permitting uniform coating over the entire surface of the lithographic printing plate M with the processing liquid.

The upwardly raised configuration of the second guide means 49 allows the lithographic printing plate M to be effectively guided to the top portion 180 of the second guide means 49. Additionally, the second guide means 49 may effectively guide the lithographic printing plate M which produces a downwardly raised curl while being fed.

The present invention as applied to the photosensitive material processing apparatus comprising the second guide means 49 for guiding upwardly the lithographic printing plate M passed through the processing liquid coating means 125, 128, the lithographic printing plate M is uniformly coated with the processing liquid in the photosensitive material processing apparatus wherein the lithographic printing plate M is liable to be fed in a raised or curved configuration.

The first guide means 48 for guiding the lithographic printing plate M upwardly achieves the uniform coating of the lithographic printing plate M with a small amount of processing liquid supplied to the lithographic printing plate M. This prevents the processing unevenness of the lithographic printing plate M resulting from the uneven coating with the processing liquid.

The first guide means comprises the guide member 48 designed to scratch off the processing liquid deposited oil the opposite surface of the lithographic printing plate M from the photosensitive surface. Under the guide member 48 is provided a recovery passage for collecting the processing liquid removed from the lithographic printing plate M by the guide member 48 in a processing liquid tank. This allows the recovery of the processing liquid deposited on the opposite surface of the lithographic printing plate M from the photosensitive surface, preventing wasteful consumption of the processing liquid.

The first guide means 48 guides the lithographic printing plate M brought into contact with the metering means upwardly at an angle ranging from 3 to 35 degrees with respect to the horizontal, permitting more uniform coating with the processing liquid.

When a metering roller 125 having an uneven surface is used as the metering means, the lithographic printing plate M may be uniformly coated with the processing liquid independently of the amount of processing liquid supplied from the processing liquid supply means.

While the invention has been described in detail, the foregoing description is in all aspects illustrative and not restrictive. It is understood that numerous other modifications and variations can be devised without departing from the scope of the invention.

We claim:

1. An apparatus for coating a photosensitive surface of a photosensitive material with a processing liquid while feeding said photosensitive material along a predetermined feed path, with said photosensitive surface positioned upside, said apparatus comprising:

a first pair of feed rollers for feeding said photosensitive material while holding said photosensitive material therebetween;

a coating device provided downstream of said first pair of feed rollers in said feed path for coating said photosensitive surface with said processing liquid, said coating device including a restriction assembly for restricting the amount of said processing liquid to be supplied;

a second pair of feed rollers provided on the downstream side from said first pair of feed rollers in said feed path for rotating in synchronism with said first pair of feed rollers to feed said photosensitive material while holding said photosensitive material therebetween;

a first guide provided between said coating device and said second pair of feed rollers for raising and guiding said photosensitive material; and a second guide provided between said first guide and said second pair of feed rollers for supporting and guiding said back surface of said photosensitive material at a first level that is higher than both a second level at which said coating device contacts said photosensitive material and a third level at which said second pair of feed rollers hold said photosensitive material therebetween.

2. The apparatus according to claim 1, wherein said first guide contacts a back surface of said photosensitive material to scratch off a predetermined amount of said processing liquid which is deposited on said back surface.

3. The apparatus according to claim 1, wherein said second guide has an upwardly raised guide surface.

4. The apparatus according to claim 1, wherein said restriction assembly further includes a grooved roller.

5. The apparatus according to claim 1, wherein said first guide raises said photosensitive material at an angle ranging from 3° to 35° relative to the horizontal.

6. The apparatus according to claim 1, wherein said restriction assembly includes a diffusing film and an anti-backflow film, said diffusing film and an anti-backflow film functioning to restrict the amount of said processing liquid to be supplied.

7. The apparatus according to claim 2, wherein said first guide includes a plate member having an edge configured for contacting the back surface of said photosensitive material.

* * * * *